(12) United States Patent
Matsuki et al.

(10) Patent No.: US 11,610,728 B2
(45) Date of Patent: Mar. 21, 2023

(54) ELECTRONIC COMPONENT AND ELECTRONIC COMPONENT MODULE

(71) Applicant: Murata Manufacturing Co., Ltd., Kyoto-fu (JP)

(72) Inventors: Yoshitaka Matsuki, Nagaokakyo (JP); Hiraku Kawai, Nagaokakyo (JP); Yuichi Iida, Nagaokakyo (JP); Masahiro Kubota, Nagaokakyo (JP); Fumihiko Naruse, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 17/459,862

(22) Filed: Aug. 27, 2021

(65) Prior Publication Data

US 2022/0068554 A1 Mar. 3, 2022

(30) Foreign Application Priority Data

Sep. 3, 2020 (JP) .............................. JP2020-148422

(51) Int. Cl.
| | |
|---|---|
| *H01F 27/29* | (2006.01) |
| *H05K 1/18* | (2006.01) |
| *H01G 2/10* | (2006.01) |
| *H01G 4/228* | (2006.01) |

(52) U.S. Cl.
CPC .............. *H01F 27/29* (2013.01); *H01G 2/10* (2013.01); *H01G 4/228* (2013.01); *H05K 1/181* (2013.01); *H05K 2201/1003* (2013.01); *H05K 2201/10015* (2013.01)

(58) Field of Classification Search
CPC ...................................................... H01F 29/29
USPC ........................................................ 174/260
See application file for complete search history.

(56) References Cited

U.S. PATENT DOCUMENTS

| | | | | |
|---|---|---|---|---|
| 6,326,125 | B1 * | 12/2001 | Kakinuma | G03F 7/033 |
| | | | | 430/281.1 |
| 9,696,476 | B1 * | 7/2017 | Glebov | G02B 5/1857 |
| 2009/0014716 | A1 * | 1/2009 | Yamaga | H01L 51/0545 |
| | | | | 257/40 |
| 2011/0195360 | A1 | 8/2011 | Flemming et al. | |
| 2017/0098501 | A1 * | 4/2017 | Flemming | H01F 41/041 |
| 2017/0355636 | A1 * | 12/2017 | Borrelli | C03C 21/005 |
| 2020/0383209 | A1 * | 12/2020 | Flemming | H01G 4/012 |
| 2021/0242412 | A1 * | 8/2021 | Fu | G01B 11/165 |
| 2022/0037082 | A1 * | 2/2022 | Lee | H01F 17/04 |

FOREIGN PATENT DOCUMENTS

| | | | |
|---|---|---|---|
| JP | 2008-109144 A | 5/2008 | |
| JP | 2008-227162 A | 9/2008 | |
| JP | 2009-206525 A | 9/2009 | |

(Continued)

*Primary Examiner* — Stanley Tso
(74) *Attorney, Agent, or Firm* — Studebaker & Brackett PC

(57) ABSTRACT

An electronic component comprising a glass body containing a photosensitizer; a conductor as at least a part of an electric element, arranged on the glass body; a terminal electrode as a terminal of the electric element, arranged above an outer surface of the glass body, with the terminal electrode being electrically connected to the conductor; and an insulating film arranged above the outer surface of the glass body. The insulating film reflects or absorbs light in a photosensitive wavelength range of the photosensitizer contained in the glass body.

20 Claims, 13 Drawing Sheets

(56) References Cited

FOREIGN PATENT DOCUMENTS

| | | |
|---|---|---|
| JP | 2015-046494 A | 3/2015 |
| JP | 2018-092223 A | 6/2018 |
| JP | 2019-046932 A | 3/2019 |
| JP | 2020-526952 A | 8/2020 |
| WO | 2019/163292 A1 | 8/2019 |

* cited by examiner

ELECTRONIC COMPONENT AND ELECTRONIC COMPONENT MODULE

CROSS REFERENCE TO RELATED APPLICATION

This application claims benefit of priority to Japanese Patent Application 2020-148422, filed Sep. 3, 2020, the entire content of which is incorporated herein by reference.

BACKGROUND

Technical Field

The present disclosure relates to an electronic component and an electronic component module.

Background Art

Up until now, as an electronic component there is one described in US2011/0195360. This electronic component has a photosensitive glass. It is assumed that at least a part of the electronic component is coated with a resin different from the photosensitive glass. The optical properties of the resin are not specified.

SUMMARY

In such a conventional electronic component, however, due to having the photosensitive glass, for example when the electronic component is exposed to UV light, $Ce^{3+}$ in the photosensitive glass may be photooxidized to cause discoloration (yellowing) in the photosensitive glass. When the photosensitive glass discolors in this manner, the electronic component is regarded as defective in visual inspection.

Accordingly, the present disclosure provides an electronic component and an electronic component module that ensure good outward appearance.

An electronic component of an aspect of the present disclosure comprises a glass body containing a photosensitizer; a conductor as at least a part of an electric element, arranged on the glass body; a terminal electrode as a terminal of the electric element, arranged above an outer surface of the glass body, the terminal electrode being electrically connected to the conductor; and an insulating film arranged above the outer surface of the glass body, the insulating film reflecting or absorbing light in a photosensitive wavelength range of the photosensitizer contained in the glass body.

As used herein, "outer surface of the glass body" does not simply mean a surface of the glass body facing its outer peripheral side, but means a surface as a boundary between the outside and the inside of the glass body. "Above the outer surface" does not refer to an absolute unidirectional direction, such as vertically above, which is defined by the direction of gravity, but refers to a direction, with respect to the outer surface, directed toward the outside, of the outside and the inside having the outer surface as the boundary therebetween. "Above" with respect to an element includes not only "above" spaced apart from the element, i.e. an upper position via another object above the element or a spaced-apart upper position, but also a directly-above position in contact with (i.e. on) the element.

According to the aspect, even if the electronic component is irradiated with light in the photosensitive wavelength range of the photosensitizer contained in the glass body, the insulating film reflects or absorbs the light to consequently reduce irradiation of the light onto the glass body. This reduces photooxidation by the light of the photosensitizer contained in the glass body, to thereby enable reduction in discoloration of the glass body arising from photooxidation. Accordingly, good outward appearance of the electronic component can be ensured.

Preferably, in an embodiment of the electronic component, the outer surface includes a bottom surface as one of main surfaces of the glass body and a top surface lying at the back of the bottom surface. Also, the terminal electrode is arranged above at least the bottom surface, while the insulating film is arranged above at least the top surface.

According to the embodiment, discoloration of the glass body can be reduced due to the insulating film arranged on at least the top surface of the glass body, although the electronic component is irradiated with light from the top surface side of the glass body after mounting the bottom surface side of the glass body of the electronic component onto the mounting board.

Preferably, in an embodiment of the electronic component, the outer surface includes the bottom surface and a plurality of side surfaces for connection of the bottom surface, and the insulating film is further arranged above at least a part of the bottom surface and the side surfaces.

According to the embodiment, discoloration of the glass body can be reduced even before mounting of the electronic component onto the mounting board.

Preferably, in an embodiment of the electronic component, the insulating film has at least one of the following features (i), (ii), and (iii):

(i) an insulation material as a base material contains fine particles with a refractive index different from that of the base material;

(ii) an insulation material with a low refractive index and an insulation material with a high refractive index are laminated together, and (iii) a material is contained that has a bandgap or a HOMO-LUMO gap less than an energy required to expose the photosensitizer of the glass body.

According to the embodiment, discoloration of the glass body by irradiation of light can be reduced.

Preferably, in an embodiment of the electronic component, the insulating film has at least one of the following features (iv), (v), and (vi):

(iv) an insulation material as a base material contains fine particles with a refractive index different from that of the base material;

(v) an insulation material with a low refractive index and an insulation material with a high refractive index are laminated together, and (vi) a material is contained that has a bandgap or a HOMO-LUMO gap equal to or less than $1240/\lambda$ [eV] when an absorption wavelength edge of the photosensitizer after exposure is $\lambda$ [nm].

According to the embodiment, discoloration of the glass body by light irradiation can be reduced, and even if the glass body becomes discolored, discoloration on the outward appearance can be reduced when observing the glass body through the insulating film.

Preferably, in an embodiment of the electronic component, the photosensitizer contains one or more lanthanoid-based elements.

According to the embodiment, mixture with glass is easier as compared with organic photosensitizers.

Preferably, in an embodiment of the electronic component, the photosensitizer contains a cerium element.

According to the embodiment, this is most inexpensive among lanthanoid-based photosensitizers.

Preferably, in an embodiment of the electronic component, the conductor has an outer-surface conductor arranged above the outer surface. The insulating film includes a directly-above-conductor portion that is in contact with the outer-surface conductor and that lies directly above the outer-surface conductor; and a directly-above-glass portion that is in contact with the glass body and that lies directly above the glass body. The thickness of the directly-above-conductor portion is smaller than a thickness of the directly-above-glass portion.

According to the embodiment, formation of the insulating film is easy since the insulating film is arranged not only above the glass body but also above the outer-surface conductor, and the dimensions of the electronic component can be reduced since the thickness of the directly-above-conductor portion is smaller than the thickness of the directly-above-glass portion.

Preferably, in an embodiment of the electronic component, the thickness of the directly-above-glass portion is greater than a thickness of the outer-surface conductor.

According to the embodiment, discoloration of the glass body can further be reduced.

Preferably, in an embodiment of the electronic component, the conductor has an outer-surface conductor arranged above the outer surface, the insulating film includes a directly-above-conductor portion that is in contact with the outer-surface conductor and that lies directly above the outer-surface conductor, and the directly-above-conductor portion has a hole part that is open on the outer-surface conductor, with all of an inner peripheral edge of the hole part toward the outer-surface conductor lying directly above the outer-surface conductor.

According to the embodiment, in the case of forming the hole part in the insulating film, only the insulating film on the outer-surface conductor is removed so that the hole part can be formed. Consequently, it is possible to securely restrain the glass body near the outer-surface conductor from being exposed due to variations, etc. in forming the hole and to further reduce discoloration of the glass body. Particularly, in the case where the hole part is formed in the insulating film by photolithography, even if the insulating film and the photosensitizer have the same photosensitive wavelength, irradiation light is blocked by the outer-surface conductor and hence cannot reach the glass body. Discoloration of the glass body can thus be reduced.

Preferably, in an embodiment of the electronic component, the insulating film includes a directly-above-terminal portion that is in contact with the terminal electrode and that lies directly above the terminal electrode, and the directly-above-terminal portion has a hole part that is open on the terminal electrode, with all of an inner peripheral edge of the hole toward the terminal electrode lying directly above the terminal electrode.

According to the embodiment, in the case of forming the hole part in the insulating film, only the insulating film on the terminal electrode is removed so that the hole part can be formed. Consequently, it is possible to securely restrain the glass body near the terminal electrode from being exposed due to variations, etc. in forming the hole part and to further reduce discoloration of the glass body. Particularly, in the case where the hole part is formed in the insulating film by photolithography, even if the insulating film and the photosensitizer have the same photosensitive wavelength, irradiation light is blocked by the terminal electrode and hence cannot reach the glass body. Discoloration of the glass body can thus be reduced.

Preferably, in an embodiment of the electronic component, the conductor has an outer-surface conductor arranged above the outer surface, and a surface roughness of an interface between the insulating film and the glass body is greater than the surface roughness of an interface between the outer-surface conductor and the glass body.

According to the embodiment, the effect of reducing discoloration of the glass body can be kept and improved without impairing high frequency characteristics of the electronic component.

Preferably, in an embodiment of the electronic component, a surface roughness of an interface between the insulating film and the glass body is greater than the surface roughness of an interface between the terminal electrode and the glass body.

According to the embodiment, the effect of reducing discoloration of the glass body can be kept and improved without impairing high frequency characteristics of the electronic component.

Preferably, in an embodiment of the electronic component, the electronic component further comprises an anchor part protruding from the terminal electrode into the interior of the glass body. In a section orthogonal to an extending direction of the anchor part, at least a part of an outer periphery of the anchor part includes a curved surface.

According to the embodiment, local stress concentration is prevented from occurring at the anchor part.

An electronic component module as an aspect of the present disclosure comprises a mounting board; and an electronic component mounted on the mounting board.

According to the aspect, there can be implemented an electronic component module having an electronic component with good outward appearance.

Preferably, in an embodiment of the electronic component module, the electronic component further comprises a sealing resin that seals up the electronic component, the sealing resin reflecting or absorbing light in a photosensitive wavelength range of the photosensitizer contained in the glass body of the electronic component.

According to the embodiment, discoloration of the electronic component can more securely be reduced when the electronic component is mounted on the mounting board.

An electronic component module as an aspect of the present disclosure comprises a mounting board; an electronic component mounted on the mounting board; and a sealing resin that seals up the electronic component. The electronic component comprises a glass body containing a photosensitizer; a conductor as at least a part of an electric element, arranged on the glass body; and a terminal electrode as a terminal of the electric element, arranged above an outer surface of the glass body, with the terminal electrode being electrically connected to the conductor. The insulating film reflects or absorbs light in a photosensitive wavelength range of the photosensitizer contained in the glass body of the electronic component.

According to the aspect, there can be implemented an electronic component module having an electronic component with good outward appearance.

According to the electronic component and the electronic component module of an aspect of the present disclosure, good outward appearance can be ensured.

DETAILED DESCRIPTION

Figure 1:
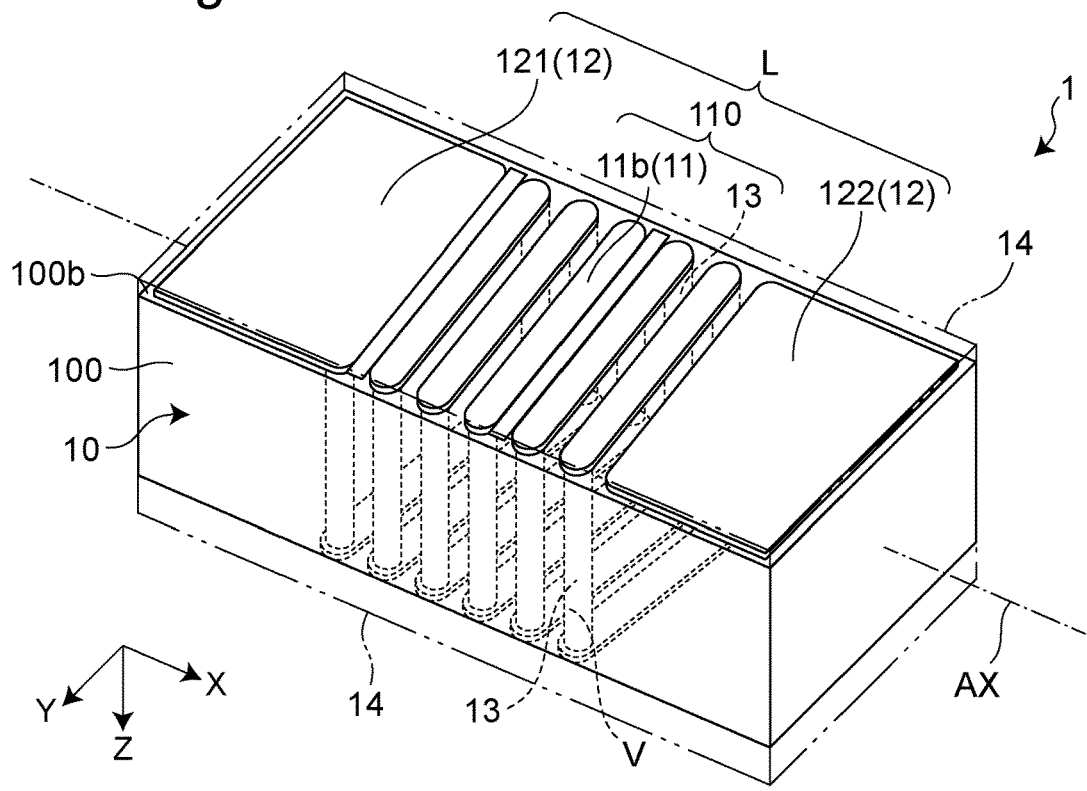
FIG. 1 is a schematic perspective view of an inductor component according to a first embodiment, viewed from a bottom surface side.

An electronic component and an electronic component module of an aspect of the present disclosure will now be described in detail with reference to embodiments shown in the drawings. Note that some of the drawings are schematic ones and may not reflect the actual dimensions or ratios.

First Embodiment

Figure 2:
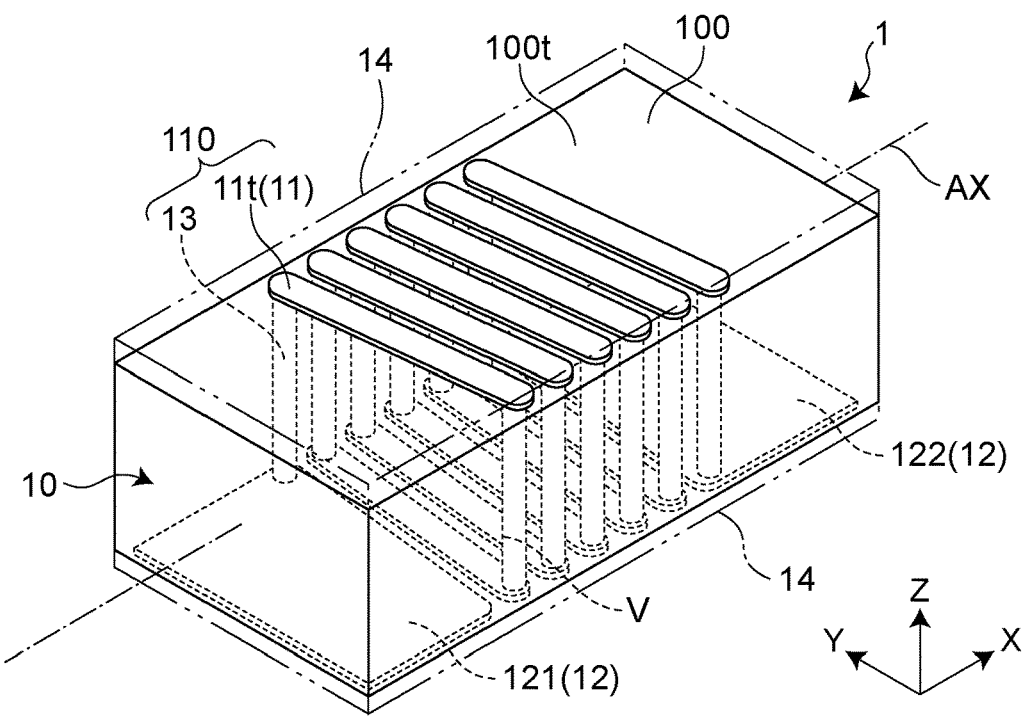
FIG. 2 is a schematic perspective view of the inductor component according to the first embodiment, viewed from a top surface side.

An inductor component 1 according to a first embodiment will be described hereinbelow. FIG. 1 is a schematic perspective view of the inductor component 1 viewed from a bottom surface side, and FIG. 2 is a schematic perspective view of the inductor component 1 viewed from a top surface side.

1. Overview Configuration

An overview configuration of the inductor component 1 will be described. The inductor component 1 is a surface-mounted electronic component including an inductor element L used in e.g. a high-frequency signal transmission circuit as an electric element. The inductor component 1 comprises a glass body 10 containing a photosensitizer; a helically extending wire 110 as a conductor arranged on the glass body 10 and constituting at least a part of the inductor element L; a terminal electrode 12 as a terminal of the inductor element L arranged above an outer surface 100 of the glass body 10 and electrically connected to the helically extending wire 110; and an insulating film 14 arranged above the outer surface 100 of the glass body 10 and reflecting or absorbing light in a photosensitive wavelength range of the photosensitizer contained in the glass body 10.

The above configuration allows the insulating film 14 to reflect or absorb light in the photosensitive wavelength range of the photosensitizer contained in the glass body 10 even if the light is irradiated on the inductor component 1, thereby enabling reduction of irradiation of the light onto the glass body 10. This restrains the photosensitizer contained in the glass body 10 from being photooxidized by the light so that discoloration of the glass body 10 by photooxidation can be reduced. Accordingly, good outward appearance of the inductor component 1 can be ensured.

The outer surface 100 of the glass body 10 includes a bottom surface 100b as one of main surfaces of the glass body 10 and a top surface 100t lying at the back of the bottom surface 100b. The terminal electrode 12 is arranged above at least the bottom surface 100b and the insulating film 14 is arranged above at least the top surface 100t.

The above configuration can reduce discoloration of the glass body 10 due to the insulating film 14 arranged on at least the top surface 100t of the glass body 10, although the inductor component 1 is irradiated with light from the top surface 100t side of the glass body 10 after mounting the bottom surface 100b side of the glass body 10 of the inductor component 1 onto a mounting board.

Hereinafter, as shown in the drawings, for convenience of explanation, let X direction be a longitudinal direction of the glass body 10 from the terminal electrode 12 (first terminal electrode 121) on one hand toward the terminal electrode 12 (second terminal electrode 122) on the other. Of directions orthogonal to X direction, Z direction is a direction from the bottom surface 100b toward the top surface 100t, while Y direction is a direction orthogonal to X direction and Z direction that constitutes a right-handed system when arranged in the order of X, Y, and Z. When the orientation is not considered, etc., directions parallel to X, Y, and Z directions, respectively, may be described as L, W, and T directions, respectively.

2. Configurations of Parts (Glass Body 10)

As shown in FIGS. 1 and 2, the glass body 10 functions as an insulator or a structure of the inductor component 1. The glass body is preferably a glass body with a photosensitivity containing a photosensitizer, represented by e.g. FoturanII (registered trademark of Schott AG).

In the case of using FoturanII as the glass body 10, the glass body 10 is selectively irradiated with UV light of 320 nm or less in wavelength and then sintered so that a portion irradiated with UV light is crystallized. Afterward, when subjected to wet etching with a hydrofluoric acid aqueous solution, the crystallized portion is selectively etched so that a through hole V can be formed within the interior of the glass body 10. For example, a mask aligner is used for the UV light irradiation, but a stepper or a UV laser may be used. Preferably, by using the mask aligner, the entire surface of the glass body 10 can be processed with one exposure, resulting in improved productivity. By using a photosensitive glass body as the glass body 10, the aspect ratio of the through hole V can be increased (for example, 5 or more), and the taper angle of the inner surface of the through hole V can be increased (for example, 87 or more).

Although the main components of the glass body 10 are $SiO_2$ and $Al_2O_3$, in addition thereto, various metal oxides such as $Li_2O_3$ may be contained. The photosensitizer contains one or more lanthanoid-based elements. This enables easier mixture with glass as compared with organic photosensitizers. Preferably, the photosensitizer contains a cerium element. This is most inexpensive among lanthanoid-based photosensitizers.

When UV light is irradiated onto $Ce^{3+}$ contained in the glass body 10, $Ce^{3+}$ is photooxidized to $Ce^{4+}$. Since this $Ce^{4+}$ has an absorption edge in the visible light region, it brings about discoloration (yellowing) of the glass body 10 as long as the UV light irradiated portion is not removed by sintering and etching. In this embodiment, discoloration of the glass body 10 can be suppressed by disposing the insulating film 14 that reflects or absorbs light in the photosensitive wavelength range of the photosensitizer contained in the glass body 10.

(Helically Extending Wire 110)

As shown in FIGS. 1 and 2, the helically extending wire 110 comprises an outer-surface conductor 11 arranged above the outer surface 100 of the glass body 10, and a through wire 13 passing through the through hole V of the glass body 10 to be electrically connected to the outer-surface conductor 11.

The outer-surface conductor 11 includes a bottom-surface conductor 11b arranged on the bottom surface 100b of the glass body 10 and a top-surface conductor 11t arranged on the top surface 100t of the glass body 10. The bottom-surface conductor 11b has a shape extending in Y direction. A plurality of bottom-surface conductor 11b are arranged in parallel along X direction. The top-surface conductor 11t extends in Y direction with a slight tilt in X direction. A plurality of top-surface conductors 11t are arranged in parallel along X direction.

The through wire 13 extends in a direction orthogonal to the bottom surface 100b and the top surface 100t. The through wire 13 is arranged on both sides in Y direction within the interior of the glass body 10. A plurality of through wires 13 are arranged in parallel along X direction on each side in Y direction.

The bottom-surface conductor 11b, the through wire 13 on one hand in Y direction, the top-surface conductor 11t, and the through wire 13 on the other in Y direction are connected in order to form a helical shape. In other words, the helically extending wire 110 extends helically around a helical-winding axis AX parallel to the bottom surface 100b.

By the above configuration, the helical-winding axis AX becomes parallel to a mount surface of the inductor component 1, with the result that a magnetic flux passing through the inner diameter of the helically extending wire 110 as a main component of magnetic fluxes generated by the inductor element L does not intersect the mounting board, thereby making it possible to reduce lowering of Q-value of the inductor element L caused by the eddy current loss and also reduce noise radiation to the mounting board.

The outer-surface conductor 11 is made of a good conductor material such as copper, silver, gold or an alloy of these. The outer-surface conductor 11 may be a metal film formed by plating, vapor deposition, sputtering, etc. or a metal sintered body coated with a conductor paste and sintered. The outer-surface conductor 11 may have a multi-layered structure in which a plurality of metal layers are laminated. The thickness of the outer-surface conductor 11 is preferably 5 μm or more and 50 μm or less (i.e., from 5 μm to 50 μm).

The outer-surface conductor 11 is preferably formed by the semi-additive process, which makes it possible to form the outer-surface conductor 11 with low electrical resistance, high accuracy, and high aspect ratio. For example, the outer-surface conductor 11 can be formed as follows. First, on the entire outer surface 100 of the individualized glass body 10, by sputtering method or electroless plating, a titanium layer and a copper layer are formed in this order to form a seed layer, and a patterned photo resist is formed on the seed layer. A copper layer is then formed by electroplating on the seed layer at the opening of the photo resist. Afterward, the photo resist and the seed layer are removed by wet etching or dry etching. Thus, the outer-surface conductor 11 patterned into any shape can be formed on the outer surface 100 of the glass body 10.

The through wire 13 can be formed within the through hole V previously formed in the glass body 10, by using the materials and processes exemplified for the outer-surface conductor 11.

Figure 3:
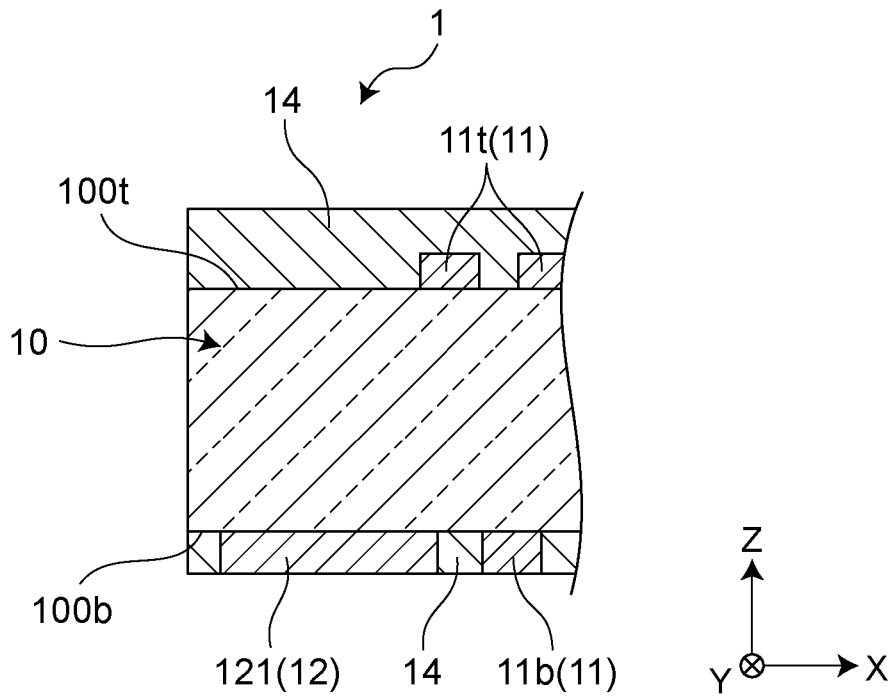
FIG. 3 is schematic sectional view of a part of the inductor component.

FIG. 3 is a partial schematic sectional view of the inductor component 1. Specifically, the section of FIG. 3 is a section including the helical-winding axis AX and orthogonal to the bottom surface 100b, with an enlarged part on the first terminal electrode 121 side. As shown in FIG. 3, the outer-surface conductor 11 is in contact with the glass body 10. Specifically, the bottom-surface conductor 11b is in contact with the bottom surface 100b, while the top-surface conductor 11t is in contact with the top surface 100t. This enables the inductor component 1 to have a reduced dimension in Z direction.

Figure 4:
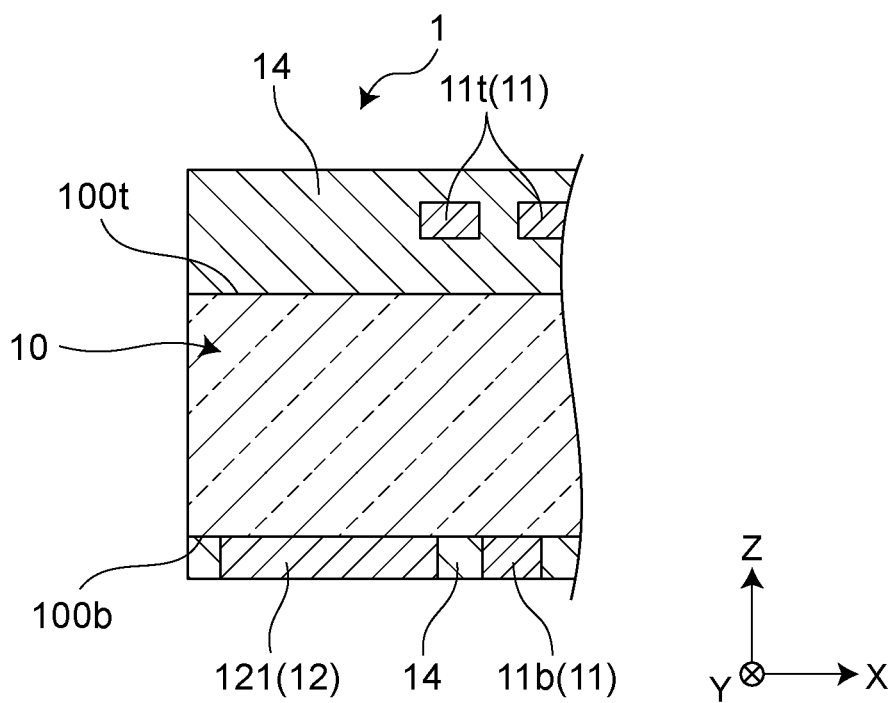
FIG. 4 is a schematic sectional view showing a variant of an outer-surface conductor and insulating film.

FIG. 4 is a schematic sectional view showing a variant of the outer-surface conductor 11 and insulating film 14 of FIG. 3. As shown in FIG. 4, the outer-surface conductor 11 need not be in direct contact with the glass body 10. That is, the outer-surface conductor 11 may be adjacent via the insulating film 14 to the glass body 10. At this time, the outer-surface conductor 11 is connected to the through wire 13 not shown in FIG. 4 via a via conductor extending through the insulating film 14.

(Terminal Electrode 12)

As shown in FIGS. 1 and 2, the terminal electrode 12 includes the first terminal electrode 121 and the second terminal electrode 122 that are input/output terminals of the inductor element L. Furthermore, in the inductor component 1, the first terminal electrode 121 and the second terminal electrode 122 are shaped to have a main surface parallel to the bottom surface 100b above the bottom surface 100b. As shown in FIG. 3, the terminal electrode 12 is exposed to the exterior of the inductor component 1.

By the above configuration, the inductor component 1 comprises, on the bottom surface 100b side, the input/output terminals of the inductor element L having a surface allowing adhesion of solder in the direction parallel to the bottom surface 100b, and therefore becomes a surface-mounted electronic component enabling surface mounting on the bottom surface 100b as the mount surface and reduction in the mounting area.

As shown in FIG. 3, the terminal electrode 12 is in contact with the glass body 10. Specifically, the first terminal electrode 121 and the second terminal electrode 122 are in contact with the bottom surface 100b. This enables a reduction in the dimension in Z direction of the inductor component 1.

Figure 5:
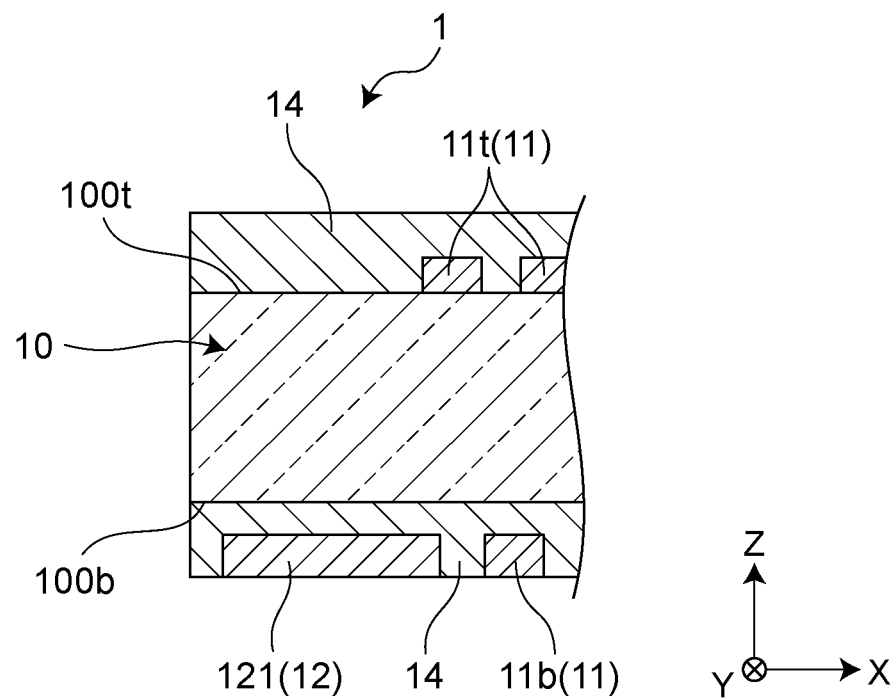
FIG. 5 is a schematic sectional view showing a variant of a terminal electrode and insulating film.

FIG. 5 is a schematic sectional view showing a variant of the terminal electrode 12 and insulating film 14 of FIG. 3. As shown in FIG. 5, the terminal electrode 12 need not be in direct contact with the glass body 10. That is, the terminal electrode 12 may be adjacent via the insulating film 14 to the glass body 10. At this time, the terminal electrode 12 is connected to the through wire 13 via the via conductor extending through the insulating film 14.

Figure 6:
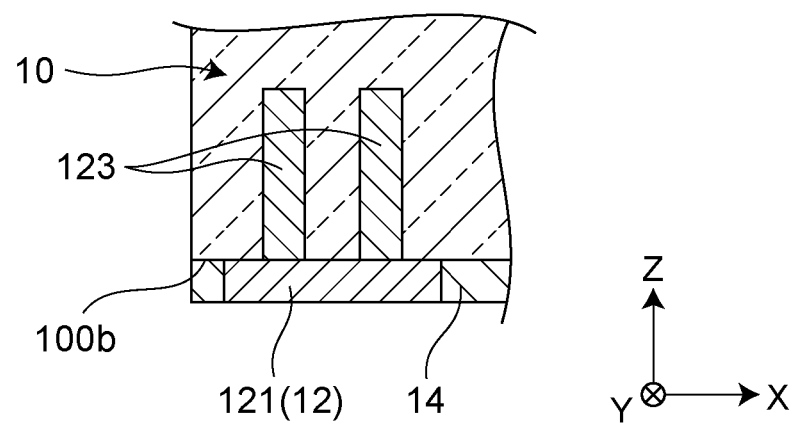
FIG. 6 is a schematic sectional view showing a variant of the terminal electrode.

FIG. 6 is a schematic sectional view showing a variant of the terminal electrode 12 of FIG. 3. As shown in FIG. 6, the inductor component 1 may further comprise an anchor part 123 protruding from the terminal electrode 12 into the interior of the glass body 10. This enables fixation of the terminal electrode 12 to the glass body 10 to be enhanced.

Figure 7A:
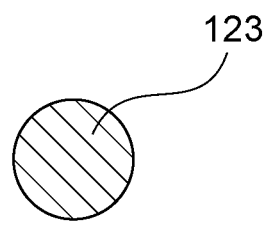
FIG. 7A is a schematic sectional view showing a variant of an anchor part.
Figure 7B:
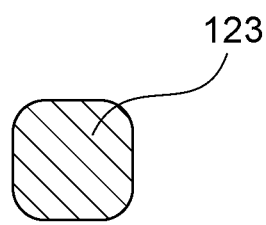
FIG. 7B is a schematic sectional view showing a variant of the anchor part.

Preferably, as shown in FIGS. 7A and 7B, the anchor part 123 has an outer periphery at least partly including a curved surface in a section orthogonal to the extending direction of the anchor part 123. FIG. 7A shows a case where the anchor part 123 has a circular sectional shape, while FIG. 7B shows a case where the anchor part 123 has a quadrangular sectional shape including convex corners. If the outer periphery of the anchor part 123 is bent in a section orthogonal to the extending direction of the anchor part 123, stress concentrates on the bent portion. On the other hand, in this embodiment, at least a part of the outer periphery of the anchor part 123 includes a curved surface so that the bent portion easily subjected to stress concentration can be reduced. This prevents local stress concentration from occurring at the anchor part 123.

To explain a process of producing the anchor part 123, for example, a non-through hole or a through hole is formed in the glass body 10 previous to forming the terminal electrode 12, and then a conductor is formed within the non-through hole or the through hole by the materials and processes exemplified for the outer-surface conductor 11. For example, a seed layer is formed on a terminal electrode formation region of the interior of the non-through hole or the through hole and its periphery, and then the conductor is formed such that the non-through hole or the through hole is filled by electroplating. The terminal electrode 12 and the anchor part 123 may be formed separately or may be formed from the same seed layer so that the terminal electrode 12 and the anchor part 123 are formed integrally to obtain the terminal electrode 12 having a higher anchor effect. Since the glass body 10 has photosensitivity, the shape of the non-through hole or through hole formed in the glass body 10 can be freely controlled and thereby the sectional shape of the anchor part 123 can be freely controlled. Accordingly, the anchor part 123 can be formed such that its outer periphery at least partly includes a curved surface.

The terminal electrode 12 is not limited to the above configuration, and three or more terminal electrodes 12 may be disposed or the terminal electrode 12 may be disposed on a side surface connecting the bottom surface 100b and the top surface 100t of the outer surface 100 of the glass body 10 and also on the top surface 100t. The terminal electrode 12 can be formed by using the materials and processes exemplified for the outer-surface conductor 11.

(Insulating Film 14)

As shown in FIGS. 1 and 2, the insulating film 14 has a function of reflecting or absorbing light in the photosensitive wavelength range of the photosensitizer contained in the glass body 10. For example, when the photosensitizer is $Ce^{3+}$, the insulating film 14 needs to reflect or absorb light having a wavelength of 320 nm or less in the photosensitive wavelength range. For imparting the light reflecting or absorbing function to the insulating film 14, the thickness of the insulating film 14 is preferably at least 100 nm or more, and more preferably 1 μm or more. The method of forming the insulating film 14 is not particularly limited. If the insulating film 14 is an inorganic compound, sputtering method or sol-gel method can be employed, while if the insulating film 14 is an organic compound, coating method, etc. can be adopted.

The insulating film 14 has at least one of the following features (i), (ii), and (iii):

(i) an insulation material as a base material contains fine particles with a refractive index different from that of the base material;

(ii) an insulation material with a low refractive index and an insulation material with a high refractive index are laminated together; and (iii) a material is contained that has a bandgap or a HOMO-LUMO gap less than an energy required to expose the photosensitizer of the glass body.

This can reduce discoloration of the glass body 10 caused by light irradiation.

In the features (i) and (ii), by making the insulating film 14 into a composite of the low-refractive-index material and the high-refractive-index material, the function of reflecting light can be imparted to the insulating film 14. Specifically, in the feature (i), fine particles with a refractive index different from that of the base material are mixed into the insulation material as the base material. In the feature (ii), two or more layered insulation materials each having a different refractive index are laminated together.

The low-refractive-index material and the high-refractive-index material can be various resins or various inorganic compounds including $SiO_2$ or other metal oxides. Note that in the case of mixing, into the insulation material as the base material, fine particles with a refractive index different from that of the base material, the base material of resin facilitates coating onto the glass body 10. In this case, the material of fine particles mixed into the resin may be different types of resin materials or $SiO_2$ or various metal oxides.

In the feature (iii), the material capable of absorbing light in the photosensitive wavelength range of the photosensitizer can be a material having a smaller bandgap or HOMO-LUMO gap as compared with an energy required to photooxidize the photosensitizer. For example, in the case of using $Ce^{3+}$ as the photosensitizer, by forming on the glass body surface a material having a bandgap or HOMO-LUMO gap less than 3.9 eV required to photooxidize $Ce^{3+}$, photooxidation of $Ce^{3+}$ and attendant discoloration of the glass body can be suppressed.

Alternatively, the insulating film 14 may have at least one of the following features (iv), (v), and (vi):

(iv) an insulation material as abase material contains fine particles with a refractive index different from that of the base material;

(v) an insulation material with a low refractive index and an insulation material with a high refractive index are laminated together; and (vi) a material is contained that has a bandgap or a HOMO-LUMO gap equal to or less than $1240/\lambda$ [eV] when the absorption wavelength edge of the photosensitizer after exposure is $\lambda$ [nm].

This can reduce discoloration of the glass body 10 caused by light irradiation, and even if the glass body becomes discolored, can reduce discoloration on the outward appearance when the glass body is observed through the insulating film.

The features (iv) and (v) are the same as the features (i) and (ii), respectively, and hence explanations thereof will be omitted.

In the feature (vi), different from the feature (iii), a material is contained that can absorb also light of a wavelength corresponding to an absorption wavelength of the photosensitizer after exposure. Hereby, even if the glass body undergoes discoloration, the outward appearance of the inductor component becomes hard to change. Specifically, ordinarily the absorption edge caused by $Ce^{4+}$ contained in a small amount in the glass lies around 400 nm, and therefore, by disposing a material whose bandgap or HOMO-LUMO gap is less than 3.1 (=1240/400) eV on the surface of the glass body, a change in the outward appearance of the inductor component arising from discoloration becomes hard to occur.

Examples of such a material include inorganic compounds or resin materials such as rutile type $TiO_2$ and various aromatic polyimides, whose bandgap or HOMO-LUMO gap is less than 3.1 eV. Use can also be made of materials colored with pigments with a narrow HOMO-LUMO gap including phthalocyanine green and carbon black.

Whether the insulating film 14 is a reflection type or an absorption type can be determined properly according to the application and purpose of the insulating film 14. In suppressing the electrical loss of the inductor component 1, the reflection type insulating film is advantageous that is not affected by the dielectric loss of the light absorbing material. On the contrary, if the reflectance of the surface of the inductor component 1 is too high for visual inspection, it may not be possible to detect defective outward appearance, which may render the absorption type insulating film advantageous.

As shown in FIG. 3, the insulating film 14 is arranged above the bottom surface 100b and the top surface 100t of the glass body 10. Although the inductor component 1 is irradiated with light from the top surface 100t side of the glass body 10 after mounting the bottom surface 100b side of the inductor component 1 onto the mounting board, discoloration of the glass body 10 can be reduced due to the insulating film 14 arranged on the top surface 100t. The insulating film 14 arranged on the bottom surface 100b can reduce discoloration of the glass body 10 even before mounting the inductor component 1 onto the mounting board.

Figure 8:
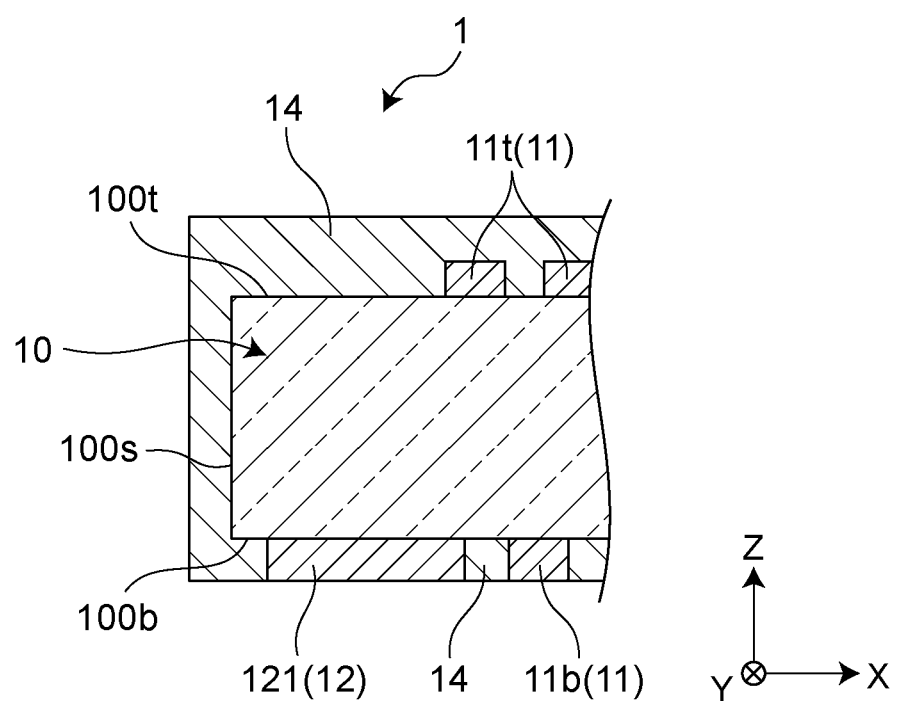
FIG. 8 is a schematic sectional view of the insulating film and its vicinity.

FIG. 8 is a schematic sectional view showing a variant of the insulating film 14 of FIG. 3. As shown in FIG. 8, the insulating film 14 may further be arranged above a side surface 100s connecting the bottom surface 100b and the top surface 100t of the outer surface 100 of the glass body 10. This enables a reduction in discoloration of the glass body 10 even before mounting of the inductor component 1 onto the mounting board. That is, in addition to the arrangement above the top surface 100t, the insulating film 14 may further be arranged above at least a part of the bottom surface 100b and the side surface 100s. The insulating film 14 may be arranged only on the top surface 100t without being disposed on the bottom surface 100b and the side surface 100s.

Figure 9:
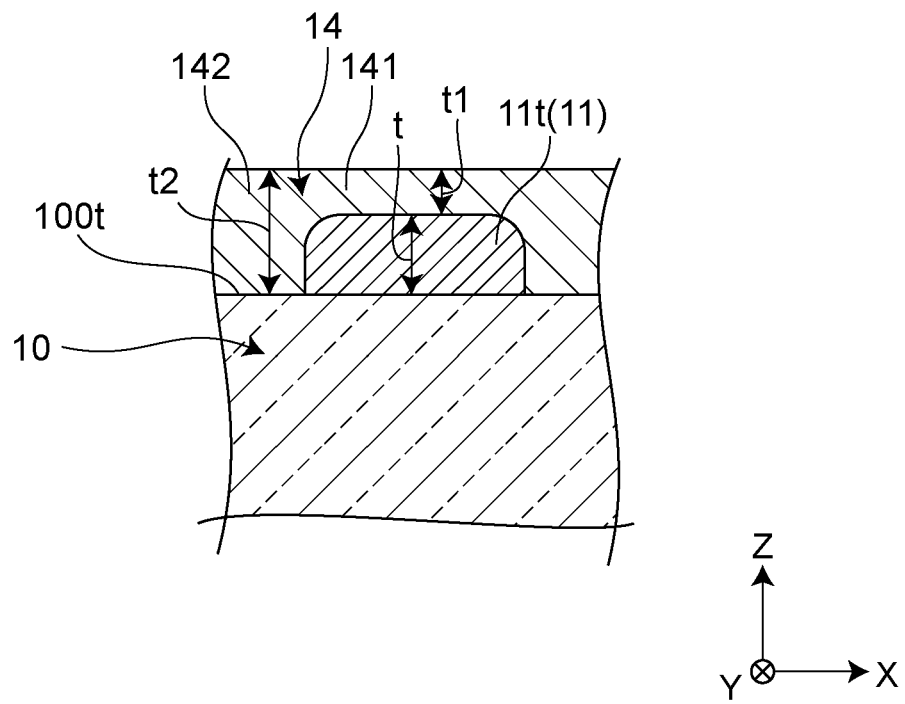
FIG. 9 is an enlarged view of the outer-surface conductor and its vicinity.

FIG. 9 is an enlarged view of the outer-surface conductor 11 and its vicinity. As shown in FIG. 9, the insulating film 14 covers the outer-surface conductor 11 on the top surface 100t. The insulating film 14 includes: a directly-above-conductor portion 141 that is in contact with the outer-surface conductor 11 and that lies directly above the outer-surface conductor 11; and a directly-above-glass portion 142 that is in contact with the glass body 10 and that lies directly above the glass body 10. A thickness t1 of the directly-above-conductor portion 141 is smaller than a thickness t2 of the directly-above-glass portion 142.

Here, the thickness of the insulating film 14 is a thickness in a direction orthogonal to the outer surface 100 lying below the insulating film 14, and in FIG. 9 for example, the thickness of the insulating film 14 (the thickness t1 of the directly-above-conductor portion 141 and the thickness t2 of the directly-above-glass portion 142) is a thickness in a direction orthogonal to the top surface 100t. When measuring these thicknesses, to eliminate the influences of R shape, chamfer shape, etc. at the glass end, the conductor end, etc., measurement is made of the directly-above-conductor portion 141 on a relatively flat conductor portion and of the directly-above-glass portion 142 on a relatively flat glass portion.

According to the above configuration, formation of the insulating film 14 is easy since the insulating film 14 is arranged not only above the glass body 10 but also above the outer-surface conductor 11, and the dimensions of the inductor component 1 can be reduced since the thickness t1 of the directly-above-conductor portion 141 is smaller than the thickness t2 of the directly-above-glass portion 142.

Usually, when taking the effect of reducing discoloration of the glass body 10 into consideration, the directly-above-conductor portion 141 of the insulating film 14 need not be disposed, but disposition of the directly-above-conductor portion 141 enables integral formation of the insulating film 14 and improvement in insulation property of the adjacent outer-surface conductor 11. Note that since the outer-surface conductor 11 blocks outside light, the directly-above-conductor portion 141 does not require the discoloration reducing effect and hence may have a smaller thickness. Furthermore, since the directly-above-conductor portion 141 is originally located higher than the directly-above-glass portion 142 due to the presence of the outer-surface conductor 11, it is preferred that the directly-above-conductor portion 141 be thinner than the directly-above-glass portion 142 from the viewpoint of the dimensions of the inductor component 1.

Preferably, the thickness t2 of directly-above-glass portion 142 is greater than a thickness t of the outer-surface conductor 11. This can further reduce discoloration of the glass body 10. Usually, when taking the effect of reducing discoloration of the glass body 10 into consideration, it is preferred that the thickness t2 of the directly-above-glass portion 142 be greatest in the insulating film 14.

Preferably, an upper surface opposite to the top surface 100t of the directly-above-conductor portion 141 is level with an upper surface opposite to the top surface 100t of the directly-above-glass portion 142. This can reduce unevenness and damage on the surface of the inductor component 1. The upper surface of the directly-above-conductor portion 141 may lie higher than the upper surface of the directly-above-glass portion 142. In other words, the upper surface of the directly-above-conductor portion 141 may have a shape that follows the upper surface of the outer-surface conductor 11.

As shown in FIG. 3, the insulating film 14 does not cover all of the terminal electrode 12. That is, the lower surface of the terminal electrode 12 opposite to the bottom surface 100$b$ is exposed from the insulating film 14. This allows the terminal electrode 12 to connect to the exterior of the inductor component 1.

Figure 10:
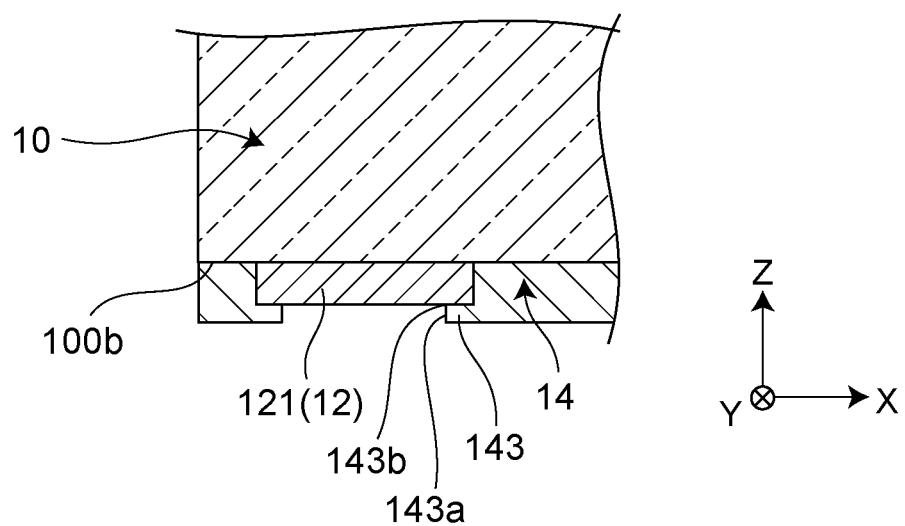
FIG. 10 is a schematic sectional view showing a variant of the insulating film.

FIG. 10 is a schematic sectional view showing a variant of the insulating film 14 of FIG. 3. As shown in FIG. 10, the insulating film 14 may include a directly-above-terminal portion 143 that is in contact with the terminal electrode 12 and that lies directly above the terminal electrode 12. The directly-above-terminal portion 143 has a hole part 143$a$ that is open on the terminal electrode 12. All of an inner peripheral edge 143$b$ of the hole 143$a$ toward the terminal electrode 12 lies directly above the terminal electrode 12.

Here, the hole part 143$a$ includes not only the case where it is a complete open hole but also the case where the interior of the open hole is filled with conductor. That is, the hole part 143$a$ may be an open hole allowing the terminal electrode 12 itself to be exposed from the hole part 143$a$ or the interior thereof may be filled with conductor.

According to the above configuration, in the case of forming the hole part 143$a$ in the insulating film 14, only the insulating film 14 on the terminal electrode 12 is removed so that the hole part 143$a$ can be formed. Consequently, it is possible to securely restrain the glass body 10 near the terminal electrode 12 from being exposed due to variations, etc. in forming the hole 143$a$ and to further reduce discoloration of the glass body 10. Particularly, in the case where the hole part 143$a$ is formed in the insulating film 14 by photolithography, even if the insulating film 14 and the photosensitizer have the same photosensitive wavelength, irradiation light is blocked by the terminal electrode 12 and hence cannot reach the glass body 10. Discoloration of the glass body 10 can thus be reduced.

Figure 11A:
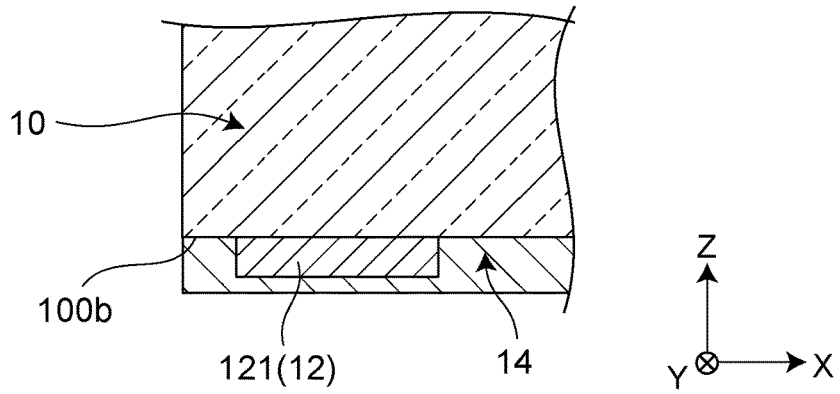
FIG. 11A is a schematic sectional view explaining a process of producing a hole part of the insulating film.
Figure 11B:
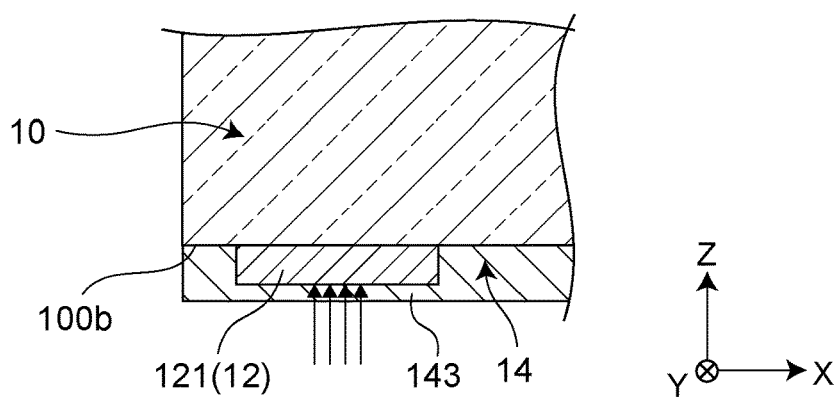
FIG. 11B is a schematic sectional view explaining the process of producing a hole part of the insulating film.
Figure 11C:
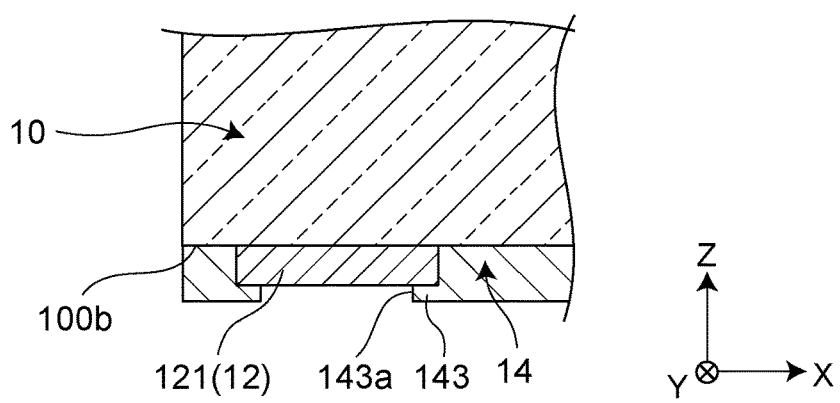
FIG. 11C is a schematic sectional view explaining the process of producing a hole part of the insulating film.

To specifically explain a process of producing the hole part 143$a$ by photolithography, the insulating film 14 is disposed so as to cover the entire surface of the terminal electrode 12 as shown in FIG. 11A. Afterward, as shown in FIG. 11B, light is irradiated on only the insulating film 14 directly above the terminal electrode 12 while avoiding the insulating film 14 directly above the glass body 10 with a mask not shown. Although at this time the light irradiation range may spread onto the insulating film 14 beyond the mask opening portion due to variations in mask alignment, etc., irradiation light is blocked by the terminal electrode 12 and cannot reach the glass body 10 if only the insulating film 14 on the terminal electrode 12 is removed taking its spread into account. Then, as shown in FIG. 11C, the insulating film 14 of a region irradiated with light is removed so that the hole part 143$a$ is formed at the directly-above-terminal portion 143. The process of forming the hole part 143$a$ may be a physical process such as using laser without being limited to photolithography.

Figure 12:
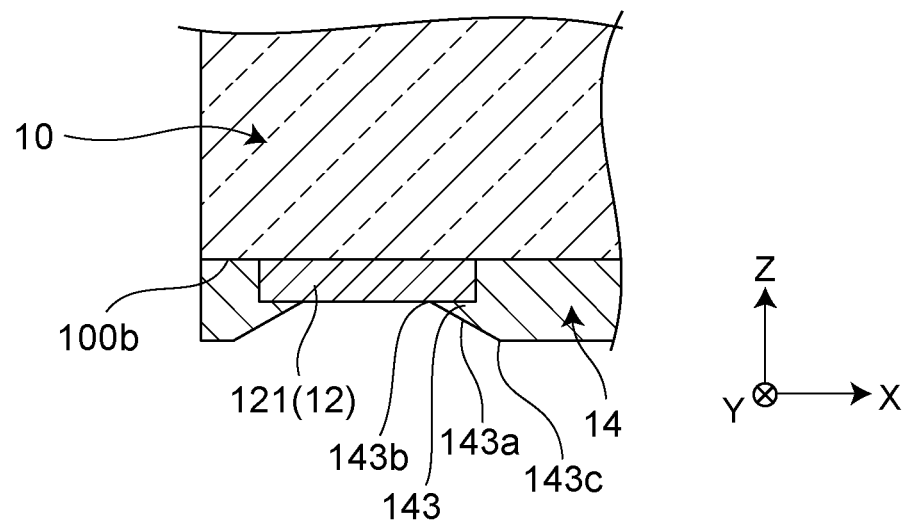
FIG. 12 is a schematic sectional view showing a variant of the hole part of the insulating film.

FIG. 12 is a schematic sectional view showing a variant of the hole part 143$a$ of FIG. 10. In FIG. 10, the inner surface shape of the hole part 143$a$ is a rectilinear shape extending along Z direction such that the width of the hole part 143$a$ toward the terminal electrode 12 is equal to the width of the hole part 143$a$ on the side opposite to the terminal electrode 12. On the other hand, as shown in FIG. 12, the inner surface shape of the hole part 143$a$ may be a tapered shape that slants with respect to Z direction such that the width of the hole part 143$a$ toward the terminal electrode 12 is smaller than the width of the hole part 143$a$ on the side opposite to the terminal electrode 12. At this time, all of the inner peripheral edge 143$b$ of the hole part 143$a$ toward the terminal electrode 12 lies directly above the terminal electrode 12, whereas all of an inner peripheral edge 143$c$ of the hole part 143$a$ on the side opposite to the terminal electrode 12 does not overlap the terminal electrode 12 when viewed from Z direction.

Figure 13:
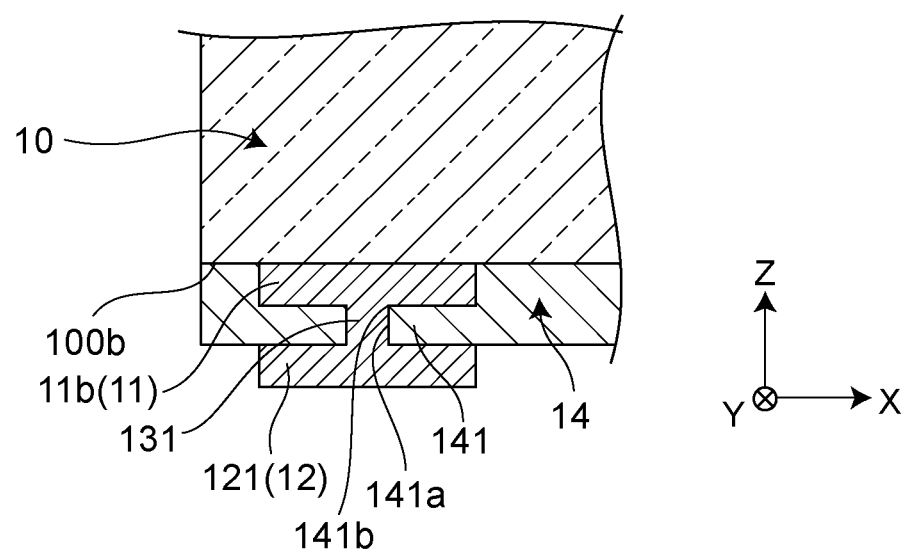
FIG. 13 is a schematic sectional view showing a variant of the terminal electrode and insulating film.

FIG. 13 is a schematic sectional view showing a variant of the terminal electrode 12 and insulating film 14 of FIG. 3. As shown in FIG. 3, the directly-above-conductor portion 141 may have a hole part 141$a$ that is open on the outer-surface conductor 11. All of an inner peripheral edge 141$b$ of the hole part 141$a$ toward the outer-surface conductor 11 lies directly above the outer-surface conductor 11. Similarly to the hole part 143$a$ of the directly-above-terminal portion 143 described above, the hole part 141$a$ of the directly-above-conductor portion 141 includes not only the case where it is a completely open hole but also the case the interior of the open hole is filled with conductor.

According to the above configuration, in the case of forming the hole part 141$a$ in the insulating film 14, only the insulating film 14 on the outer-surface conductor 11 is removed so that the hole part 141$a$ can be formed. Consequently, it is possible to securely restrain the glass body 10 in the vicinity of the outer-surface conductor 11 from being exposed due to variations, etc. in forming the hole 141$a$ and to further reduce discoloration of the glass body 10. Particularly, in the case where the hole part 141$a$ is formed in the insulating film 14 by photolithography, even if the insulating film 14 and the photosensitizer have the same photosensitive wavelength, irradiation light is blocked by the outer-surface conductor 11 and hence cannot reach the glass body 10. Discoloration of the glass body 10 can thus be reduced.

Furthermore, by filling the hole part 141$a$ with a via conductor 131, the outer-surface conductor 11 can be connected via the via conductor 131 to the terminal electrode 12 exposed from the insulating film 14. This is preferable in that the terminal electrode 12 is exposed while reducing discoloration of the glass body 10. Ordinarily, the via conductor 131 is formed inside of the outer-surface conductor 11 when viewed from the bottom surface 100$b$ side. For this reason, also when removing the insulating film 14 of the portion to dispose the via conductor 131 by use of laser irradiation or photolithography, irradiation light is blocked by the outer-surface conductor 11 and cannot arrive at the glass body 10.

Figure 14A:
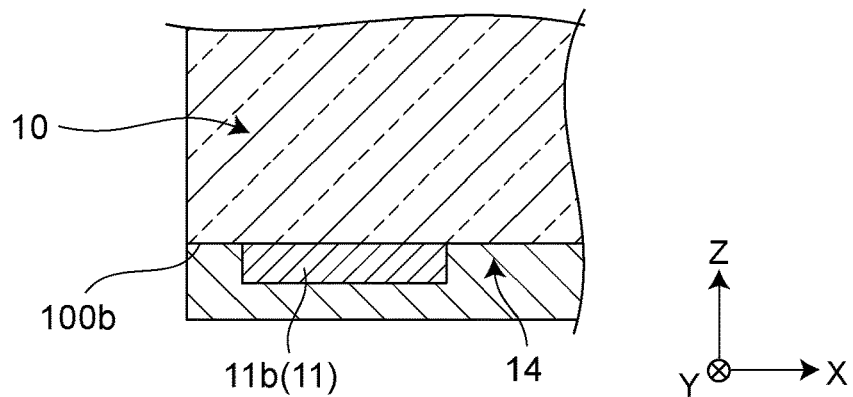
FIG. 14A is a schematic sectional view explaining a process of producing a hole part of the insulating film.
Figure 14B:
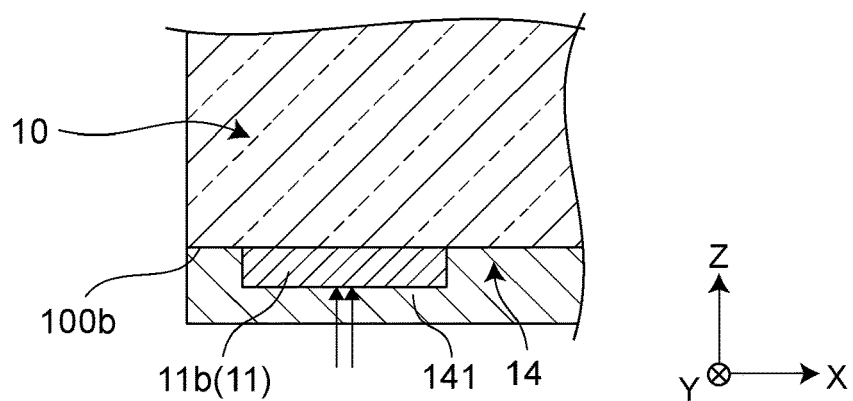
FIG. 14B is a schematic sectional view explaining the process of producing a hole part of the insulating film.
Figure 14C:
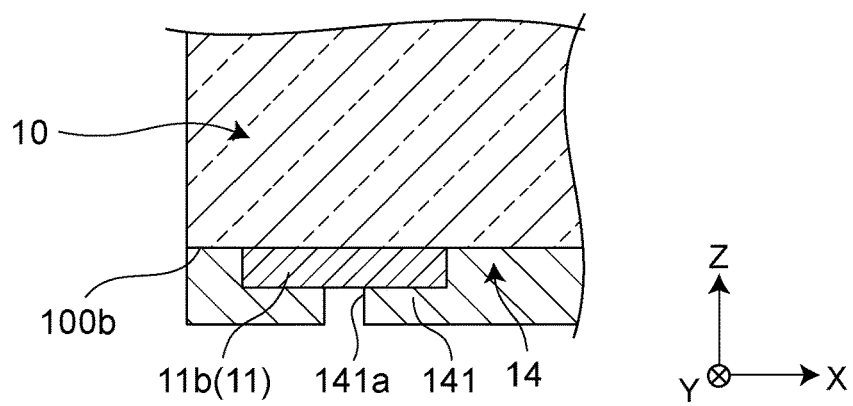
FIG. 14C is a schematic sectional view explaining the process of producing a hole part of the insulating film.
Figure 14D:
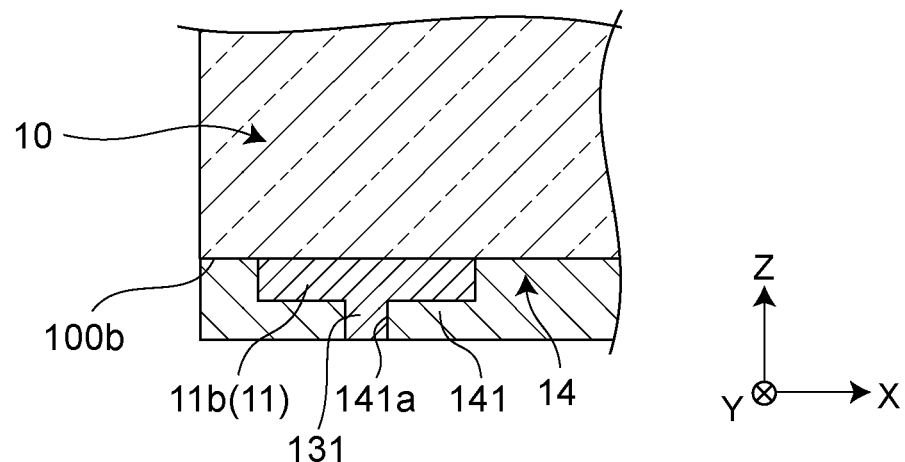
FIG. 14D is a schematic sectional view explaining the process of producing a hole part of the insulating film.
Figure 14E:
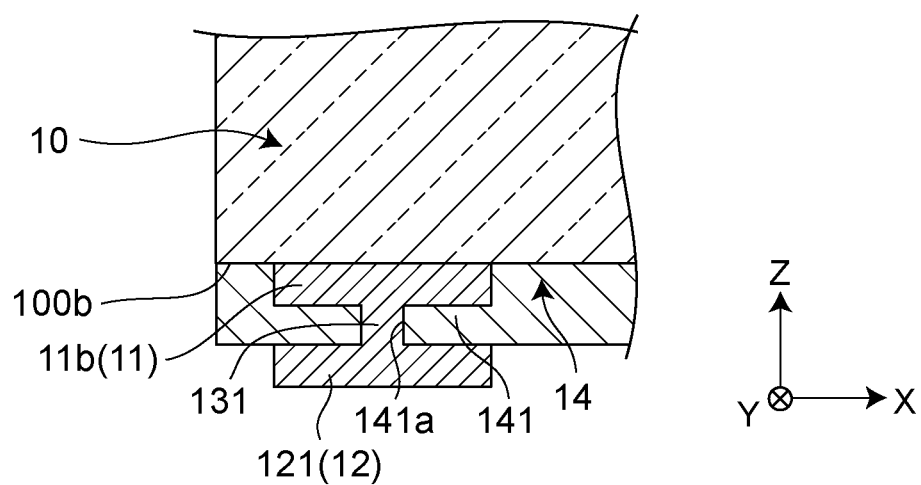
FIG. 14E is a schematic sectional view explaining the process of producing a hole part of the insulating film.

To specifically explain a process of producing the hole part 141$a$ by photolithography, the insulating film 14 is disposed so as to cover the entire surface of the outer-surface conductor 11 as shown in FIG. 14A. Afterward, as shown in FIG. 14B, light is irradiated on only the insulating film 14 directly above the outer-surface conductor 11 while avoiding the insulating film 14 directly above the glass body 10 with a mask not shown. Although at this time the light irradiation range may spread onto the insulating film 14 beyond the mask opening portion due to variations in mask alignment, etc., irradiation light is blocked by the outer-surface conductor 11 and cannot reach the glass body 10 if only the insulating film 14 on the outer-surface conductor 11 is removed taking its spread into account. Then, as shown in FIG. 14C, the insulating film 14 of a region irradiated with light is removed so that the hole part 143$a$ is formed at the directly-above-terminal portion 143. Subsequently, as shown in FIG. 14D, the hole part 141$a$ is filled with the via conductor 131, and as shown in FIG. 14E, the terminal electrode 12 is disposed on the insulating film 14 so as to connect to the via conductor 131. The process of forming the hole part 141$a$ may be a physical process such as using laser without being limited to photolithography.

Figure 15:
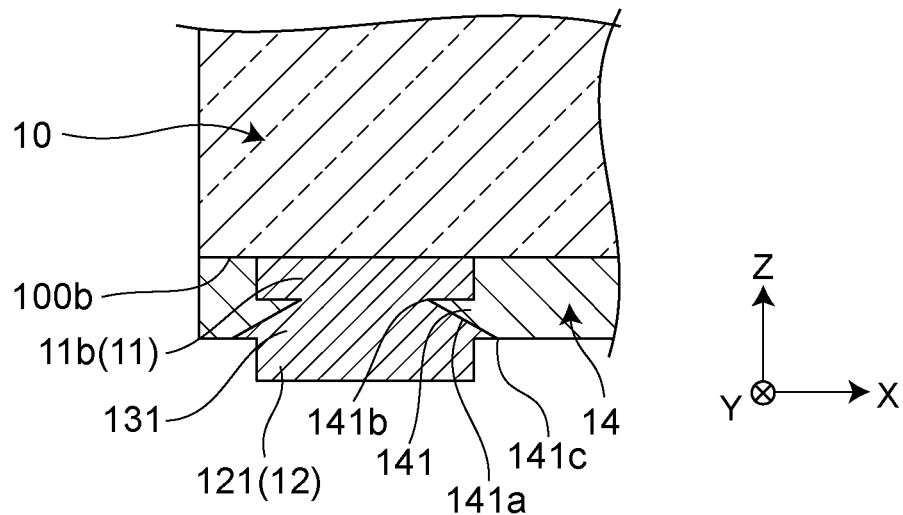
FIG. 15 is a schematic sectional view showing a variant of the hole part of the insulating film.

FIG. 15 is a schematic sectional view showing a variant of the hole part 141$a$ of FIG. 13. In FIG. 13, the inner surface shape of the hole part 141a is a rectilinear shape extending along Z direction such that the width of the hole part 141a toward the outer-surface conductor 11 is equal to the width of the hole part 141a toward the terminal electrode 12. On the other hand, as shown in FIG. 15, the inner surface shape of the hole part 141a may be a tapered shape that slants with respect to Z direction such that the width of the hole part 141a toward the outer-surface conductor 11 is smaller than the width of the hole part 141a toward the terminal electrode 12. At this time, all of the inner peripheral edge 141b of the hole part 141a toward the outer-surface conductor 11 lies directly above the outer-surface conductor 11, whereas all of an inner peripheral edge 141c of the hole part 141a toward the terminal electrode 12 does not overlap the outer-surface conductor 11 when viewed from Z direction.

Figure 16:
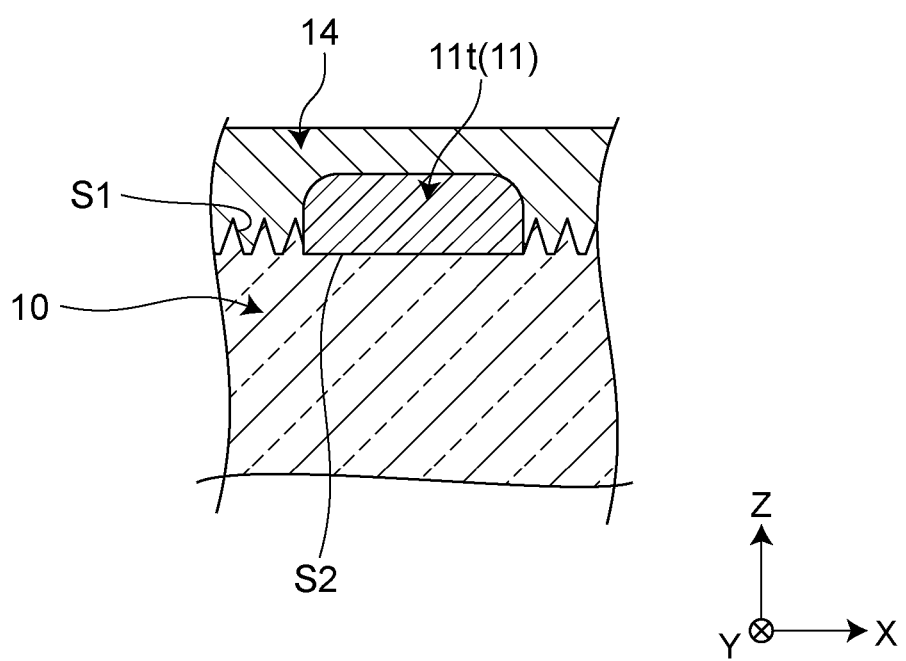
FIG. 16 is a schematic sectional view showing a variant of the vicinity of the outer-surface conductor.

FIG. 16 is a schematic sectional view showing a variant of the vicinity of the outer-surface conductor 11 of FIG. 3. As shown in FIG. 16, preferably, the surface roughness of an interface S1 between the insulating film 14 and the glass body 10 is greater than the surface roughness of an interface S2 between the outer-surface conductor 11 and the glass body 10. This enables the effect of reducing discoloration of the glass body 10 to be kept and improved without impairing high frequency characteristics of the inductor component 1.

Specifically, due to the greater surface roughness of the interface S1 between the insulating film 14 and the glass body 10, light arriving at the outer surface of the glass body 10 scatters so that, in particular, discoloration in the deep part of the glass body 10 is further suppressed. In addition, the intimate adhesion between the insulating film 14 and the glass body 10 is improved so that the effect of reducing discoloration of the glass body 10 by the insulating film 14 becomes easier to sustain. On the contrary, if the interface S2 between the outer-surface conductor 11 and the glass body 10 has a greater surface roughness, the above effect cannot be expected and, rather, the rougher surface shape of the outer-surface conductor 11 allows electric current to concentrate at the rough surface portion of the outer-surface conductor 11 when high-frequency signals pass through the outer-surface conductor 11, resulting in worsened loss, to consequently impair the high frequency characteristics. For this reason, it is preferred that the surface roughness of the interface S2 between the outer-surface conductor 11 and the glass body 10 be smaller.

A method of increasing the surface roughness of the interface S1 between the insulating film 14 and the glass body 10 includes for example: forming the outer-surface conductor 11 and the terminal electrode 12 on the top surface 100t or the bottom surface 100b of the glass body 10; thereafter performing dry etching, wet etching, blasting, etc. to roughen the outer surface of the glass body 10; and then forming the insulating film 14 so that the surface roughness of the interface S1 between the insulating film 14 and the glass body 10 can selectively be increased.

Similarly, the surface roughness of the interface between the insulating film 14 and the glass body 10 is preferably greater than the surface roughness of the interface between the terminal electrode 12 and the glass body 10. This enables the effect of reducing discoloration of the glass body 10 to be kept and improved without impairing the high frequency characteristics of the inductor component 1.

Second Embodiment

Figure 17:
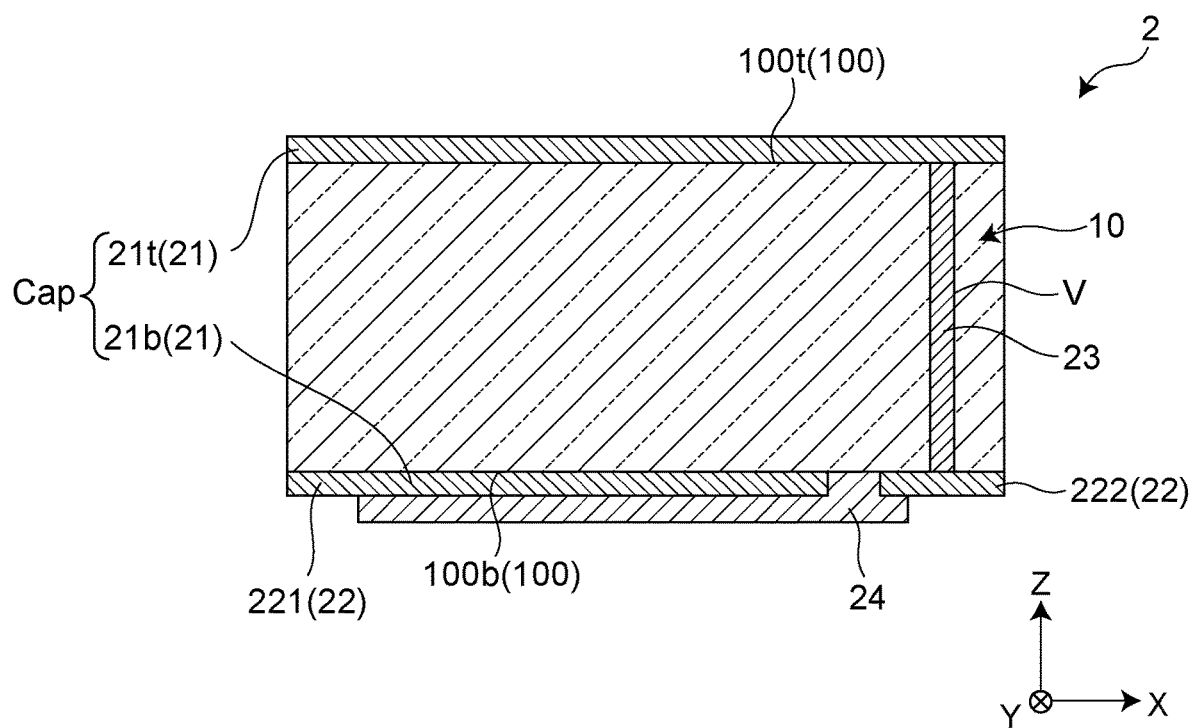
FIG. 17 is a schematic sectional view of a capacitor component according to a second embodiment.

Although in the first embodiment the outer-surface conductor was a part of the inductor component, the outer-surface conductor is not limited thereto and may be a part of an electric element other than the inductor element L. FIG. 17 is a schematic sectional view of a capacitor component 2 according to a second embodiment. As shown in FIG. 17, the capacitor component 2 is a surface-mounted electronic component including as an electric element a capacitor element Cap that is widely used in electronic circuits.

The capacitor component 2 comprises: the glass body 10 containing the photosensitizer described above; an outer-surface conductor 21 that is arranged above the outer surface 100 of the glass body 10 and that is a part of the capacitor element Cap as an electric element; a terminal electrode 22 as a terminal of the capacitor element Cap that is arranged above the outer surface 100 and electrically connected to the outer-surface conductor 21; and an insulating film 24 that is arranged above the outer surface 100 of the glass body 10 and that reflects or absorbs light in the photosensitive wavelength range of the photosensitizer contained in the glass body 10.

By the above configuration, even if the capacitor component 2 is irradiated with light in the photosensitive wavelength range of the photosensitizer contained in the glass body 10, the insulating film 24 reflects or absorbs the light to consequently reduce irradiation of the light onto the glass body 10. This reduces photooxidation by the light of the photosensitizer contained in the glass body 10, to thereby enable reduction in discoloration of the glass body 10 arising from photooxidation. Good outward appearance of the capacitor component 2 can thus be ensured.

In the capacitor component 2, the outer surface 100 of the glass body 10 includes the bottom surface 100b as one of the main surfaces of the glass body 10 and the top surface 100t lying at the back of the bottom surface 100b, while the outer-surface conductor 21 includes a flat-plate-like flat bottom-surface electrode 21b arranged above the bottom surface 100b (in the direction opposite to Z direction of FIG. 17) and a flat-plate-like flat top-surface electrode 21t arranged above the top surface 100t (in Z direction of FIG. 17).

By the above configuration, in the capacitor component 2, the capacitor element Cap is configured by allowing the flat bottom-surface electrode 21b and the flat top-surface electrode 21t to face each other via the glass body 10 as a dielectric layer.

The capacitor component 2 further comprises a through wire 23 that is at least a part of the capacitor element Cap extending through the through hole V formed in the glass body 10 and electrically connected to the outer-surface conductor 21.

The above configuration enables the capacitor component 2 to form wiring in the vertical direction with respect to the outer-surface conductor 21 and the terminal electrode 22 arranged above the outer surface 100, contributing to improved degree of freedom for forming the capacitor element Cap. In the capacitor component 2, the through wire 23 is a wire connecting the flat top-surface electrode 21t and the terminal electrode 22 together.

In the capacitor component 2, the terminal electrode 22 includes a first terminal electrode 221 and a second terminal electrode 222 that are input/output terminals of the capacitor element Cap, with the first terminal electrode 221 and the second terminal electrode 222 defining a main surface parallel to the bottom surface 100b above the bottom surface 100b (in the direction opposite to Z direction).

By the above configuration, the capacitor component 2 comprises, on the bottom surface 100b side, the input/output terminals of the capacitor element Cap having a surface allowing adhesion of solder in the direction parallel to the bottom surface 100b, and therefore becomes a surface-mounted electronic component enabling surface mounting on the bottom surface 100b as the mount surface and reduction in the mounting area.

The insulating film 24 covers a portion exposed from the flat bottom-surface electrode 21b on the bottom surface 100b of the glass body 10. The characteristics of the insulating film 24 are similar to those of the insulating film 14 of the first embodiment. As a result, even if the portion exposed on the bottom surface 100b of the glass body 10 is irradiated with light in the photosensitive wavelength range of the photosensitizer contained in the glass body 10, the insulating film 24 reflects or absorbs the light to consequently reduce irradiation of the light onto the glass body 10, thereby enabling reduction in discoloration caused by photooxidation of the glass body 10.

Furthermore, the insulating film 24 covers a part of the flat bottom-surface electrode 21b. This means that since the insulating film 24 allows apart of the flat bottom-surface electrode 21b to be exposed, the part can act as the terminal electrode 22 (first terminal electrode 221).

Third Embodiment

Figure 18:
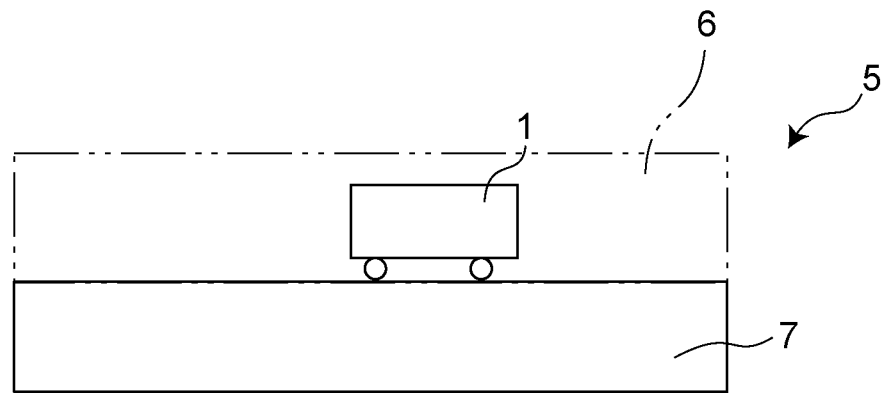
FIG. 18 is a schematic sectional view of an electronic component module according to a third embodiment.

FIG. 18 is a schematic sectional view of an electronic component module 5. As shown in FIG. 18, the electronic component module 5 comprises a mounting board 7 and the inductor component 1 mounted on the mounting board 7. This can implement the electronic component module 5 having the inductor component 1 with good outward appearance.

The mounting board 7 may be one equivalent to a printed circuit board; may be an auxiliary board mounted on the printed circuit board such as a motherboard substrate; or may be a built-in board used within the semiconductor or electronic module, such as an interposer substrate. Instead of the inductor component 1, the capacitor component 2 of the second embodiment may be used, or both the inductor component 1 and the capacitor component 2 may be used.

Preferably, the electronic component module 5 may further comprise a sealing resin 6 that seals up the inductor component 1. The sealing resin 6 reflects or absorbs light in the photosensitive wavelength range of the photosensitizer contained in the glass body 10 of the inductor component 1. The characteristics of the sealing resin 6 are similar to those of the insulating film 14 of the first embodiment, and therefore detailed description thereof will be omitted. This can reduce more securely discoloration of the inductor component 1 that may occur when the inductor component 1 is mounted on the mounting board 7.

Fourth Embodiment

Figure 19:
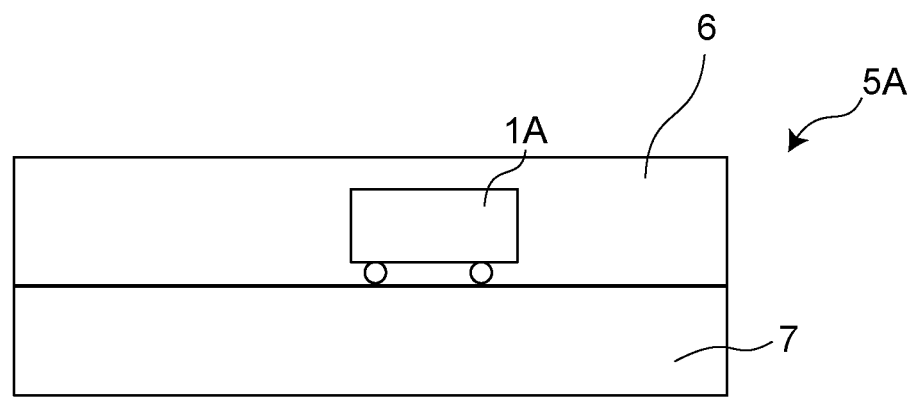
FIG. 19 is a schematic sectional view of an electronic component module according to a fourth embodiment.

FIG. 19 is a schematic sectional view of an electronic component module 5A. As shown in FIG. 19, the electronic component module 5A comprises the mounting board 7, an inductor component 1A as an electronic component mounted on mounting board 7, and the sealing resin 6 that seals up the inductor component 1A.

The inductor component 1A comprises: a glass body containing a photosensitizer; a conductor as at least a part of an electric element, arranged on the glass body; and a terminal electrode as a terminal of the electric element, arranged above the outer surface of the glass body and electrically connected to the conductor. That is, the inductor component 1A differs from the inductor component 1 of the first embodiment in that there is no insulating film 14 of the inductor component 1 of the first embodiment, but is similar in the other configurations to the inductor component 1 of the first embodiment. For this reason, detailed description of the inductor component 1A will be omitted.

The sealing resin 6 reflects or absorbs light in the photosensitive wavelength region of the photosensitizer contained in the glass body of the inductor component 1A. Characteristics of the sealing resin 6 are similar to those of the insulating film 14 of the first embodiment, and hence detailed description thereof will be omitted. This can implement the electronic component module 5A having the inductor component 1A with good outward appearance.

It is to be noted that the present disclosure is not limited to the above embodiments and that the design may be changed without departing from the gist of the present disclosure. For example, the features of each of the first to fourth embodiments may variously be combined.

Although in the first to third embodiments, the inductor component or the capacitor component has been used as the electronic component, any electronic component may be used as long as it comprises: a glass body containing a photosensitizer; a conductor as at least a part of an electric element, arranged on the glass body; a terminal electrode as a terminal of the electric element, arranged above the outer surface of the glass body and electrically connected to the conductor, and an insulating film arranged above the outer surface of the glass body and reflecting or absorbing light in a photosensitive wavelength range of the photosensitizer contained in the glass body.

Although in the fourth embodiment, the inductor component has been used as the electronic component, the capacitor component may be used instead or any electronic component may be used as long as it comprises: a glass body containing a photosensitizer; a conductor as at least a part of an electric element, arranged on the glass body; and a terminal electrode as a terminal of the electric element, arranged above the outer surface of the glass body and electrically connected to the conductor.

What is claimed is:

1. An electronic component comprising:
a glass body containing a photosensitizer;
a conductor as at least a part of an electric element, arranged on the glass body;
a terminal electrode as a terminal of the electric element, arranged above an outer surface of the glass body, the terminal electrode being electrically connected to the conductor; and
an insulating film arranged above the outer surface of the glass body, the insulating film reflecting or absorbing light in a photosensitive wavelength range of the photosensitizer contained in the glass body.

2. The electronic component of claim 1, wherein
the outer surface includes a bottom surface as one of main surfaces of the glass body and a top surface lying at the back of the bottom surface, and
the terminal electrode is arranged above at least the bottom surface, while the insulating film is arranged above at least the top surface.

3. The electronic component of claim 2, wherein
the outer surface includes the bottom surface and a plurality of side surfaces for connection of the bottom surface, and
the insulating film is further arranged above at least a part of the bottom surface and the side surfaces.

4. The electronic component of claim 2, wherein
the insulating film has at least one of the following features (i), (ii), and (iii):

(i) an insulation material as a base material contains fine particles with a refractive index different from that of the base material;
(ii) an insulation material with a low refractive index and an insulation material with a high refractive index are laminated together; and
(iii) a material is contained that has a bandgap or a HOMO-LUMO gap less than an energy required to expose the photosensitizer of the glass body.

5. The electronic component of claim 2, wherein
the insulating film has at least one of the following features (iv), (v), and (vi):
(iv) an insulation material as a base material contains fine particles with a refractive index different from that of the base material;
(v) an insulation material with a low refractive index and an insulation material with a high refractive index are laminated together; and
(vi) a material is contained that has a bandgap or a HOMO-LUMO gap equal to or less than $1240/\lambda$ [eV] when an absorption wavelength edge of the photosensitizer after exposure is $\lambda$ [nm].

6. The electronic component of claim 2, wherein
the photosensitizer contains one or more lanthanoid-based elements.

7. The electronic component of claim 1, wherein
the insulating film has at least one of the following features (i), (ii), and (iii):
(i) an insulation material as a base material contains fine particles with a refractive index different from that of the base material;
(ii) an insulation material with a low refractive index and an insulation material with a high refractive index are laminated together; and
(iii) a material is contained that has a bandgap or a HOMO-LUMO gap less than an energy required to expose the photosensitizer of the glass body.

8. The electronic component of claim 1, wherein
the insulating film has at least one of the following features (iv), (v), and (vi):
(iv) an insulation material as a base material contains fine particles with a refractive index different from that of the base material;
(v) an insulation material with a low refractive index and an insulation material with a high refractive index are laminated together; and
(vi) a material is contained that has a bandgap or a HOMO-LUMO gap equal to or less than $1240/\lambda$ [eV] when an absorption wavelength edge of the photosensitizer after exposure is $\lambda$ [nm].

9. The electronic component of claim 1, wherein
the photosensitizer contains one or more lanthanoid-based elements.

10. The electronic component of claim 1, wherein
the photosensitizer contains a cerium element.

11. The electronic component of claim 1, wherein
the conductor has an outer-surface conductor arranged above the outer surface,
the insulating film includes:
a directly-above-conductor portion that is in contact with the outer-surface conductor and that lies directly above the outer-surface conductor, and
a directly-above-glass portion that is in contact with the glass body and that lies directly above the glass body, and
a thickness of the directly-above-conductor portion is smaller than a thickness of the directly-above-glass portion.

12. The electronic component of claim 11, wherein
the thickness of the directly-above-glass portion is greater than a thickness of the outer-surface conductor.

13. The electronic component of claim 1, wherein
the conductor has an outer-surface conductor arranged above the outer surface,
the insulating film includes a directly-above-conductor portion that is in contact with the outer-surface conductor and that lies directly above the outer-surface conductor, and
the directly-above-conductor portion has a hole part that is open on the outer-surface conductor, with all of an inner peripheral edge of the hole part toward the outer-surface conductor lying directly above the outer-surface conductor.

14. The electronic component of claim 1, wherein
the insulating film includes a directly-above-terminal portion that is in contact with the terminal electrode and that lies directly above the terminal electrode, and
the directly-above-terminal portion has a hole part that is open on the terminal electrode, with all of an inner peripheral edge of the hole toward the terminal electrode lying directly above the terminal electrode.

15. The electronic component of claim 1, wherein
the conductor has an outer-surface conductor arranged above the outer surface, and
a surface roughness of an interface between the insulating film and the glass body is greater than the surface roughness of an interface between the outer-surface conductor and the glass body.

16. The electronic component of claim 1, wherein
a surface roughness of an interface between the insulating film and the glass body is greater than the surface roughness of an interface between the terminal electrode and the glass body.

17. The electronic component of claim 1, further comprising:
an anchor part protruding from the terminal electrode into the interior of the glass body, and
in a section orthogonal to an extending direction of the anchor part, at least a part of an outer periphery of the anchor part includes a curved surface.

18. An electronic component module comprising:
a mounting board; and
an electronic component of claim 1, mounted on the mounting board.

19. The electronic component module of claim 18, further comprising:
a sealing resin that seals up the electronic component, the sealing resin reflecting or absorbing light in a photosensitive wavelength range of the photosensitizer contained in the glass body of the electronic component.

20. An electronic component module comprising:
a mounting board;
an electronic component mounted on the mounting board; and
a sealing resin that seals up the electronic component,
the electronic component comprising:
a glass body containing a photosensitizer;
a conductor as at least a part of an electric element, arranged on the glass body; and a terminal electrode as a terminal of the electric element, arranged above an outer surface of the glass body, the terminal electrode being electrically connected to the conductor, the insulating film reflecting or absorbing light in a photosensitive wavelength range of the photosensitizer contained in the glass body of the electronic component.

* * * * *